US009117403B2

(12) United States Patent
Omoto

(10) Patent No.: US 9,117,403 B2
(45) Date of Patent: Aug. 25, 2015

(54) DISPLAY PANEL, DISPLAY, AND ELECTRONIC UNIT HAVING OPENINGS ARRANGED IN A CLOSE PACKING MANNER

(75) Inventor: Keisuke Omoto, Kanagawa (JP)

(73) Assignee: SONY CORPORATION (JP)

( * ) Notice: Subject to any disclaimer, the term of this patent is extended or adjusted under 35 U.S.C. 154(b) by 145 days.

(21) Appl. No.: 13/599,033

(22) Filed: Aug. 30, 2012

(65) Prior Publication Data

US 2013/0057456 A1 Mar. 7, 2013

(30) Foreign Application Priority Data

Sep. 7, 2011 (JP) ................................ 2011-194811

(51) Int. Cl.
*H05B 33/14* (2006.01)
*H01L 51/52* (2006.01)
*G09G 3/32* (2006.01)
*H01L 27/32* (2006.01)

(52) U.S. Cl.
CPC .......... *G09G 3/3225* (2013.01); *H01L 27/3218* (2013.01); *H01L 51/5218* (2013.01); *H01L 51/5225* (2013.01); *H01L 51/5271* (2013.01); *H01L 27/3213* (2013.01); *H01L 27/3276* (2013.01)

(58) Field of Classification Search
CPC ............ G09G 3/3225; H01L 27/3213; H01L 27/3218; H01L 27/3276; H01L 51/5218; H01L 51/5225; H01L 51/5271

USPC .................................................. 313/504–506
See application file for complete search history.

(56) References Cited

U.S. PATENT DOCUMENTS

| 8,780,019 B2* | 7/2014 | Choi et al. ...................... 345/77 |
| 2004/0113550 A1* | 6/2004 | Adachi et al. ................. 313/512 |
| 2004/0183436 A1* | 9/2004 | Ito et al. ......................... 313/506 |
| 2004/0246426 A1* | 12/2004 | Wang et al. .................... 349/146 |
| 2005/0116620 A1* | 6/2005 | Kobayashi .................... 313/503 |
| 2006/0132668 A1* | 6/2006 | Park et al. ....................... 349/48 |
| 2008/0001536 A1* | 1/2008 | Tsai et al. ..................... 313/506 |
| 2011/0012820 A1* | 1/2011 | Kim et al. ....................... 345/82 |
| 2011/0012935 A1* | 1/2011 | Seo et al. ...................... 345/690 |

FOREIGN PATENT DOCUMENTS

| JP | 2008-083272 | 4/2008 |
| JP | 2011-023240 | 2/2011 |

* cited by examiner

*Primary Examiner* — Sikha Roy
(74) *Attorney, Agent, or Firm* — Sheridan Ross P.C.

(57) ABSTRACT

A display panel includes a unit for each sub-pixel, the unit including a plurality of openings, the unit having an array structure in which the openings are arranged in a close packing manner. In the array structure of the unit, when a single virtual opening is placed within a peripheral region of the unit, and a center of the virtual opening and centers of a plurality of openings located adjacent to the virtual opening are connected to one another by straight lines, only one basic figure for the arrangement in the close packing manner is created but two basic figures therefor are not created.

19 Claims, 25 Drawing Sheets

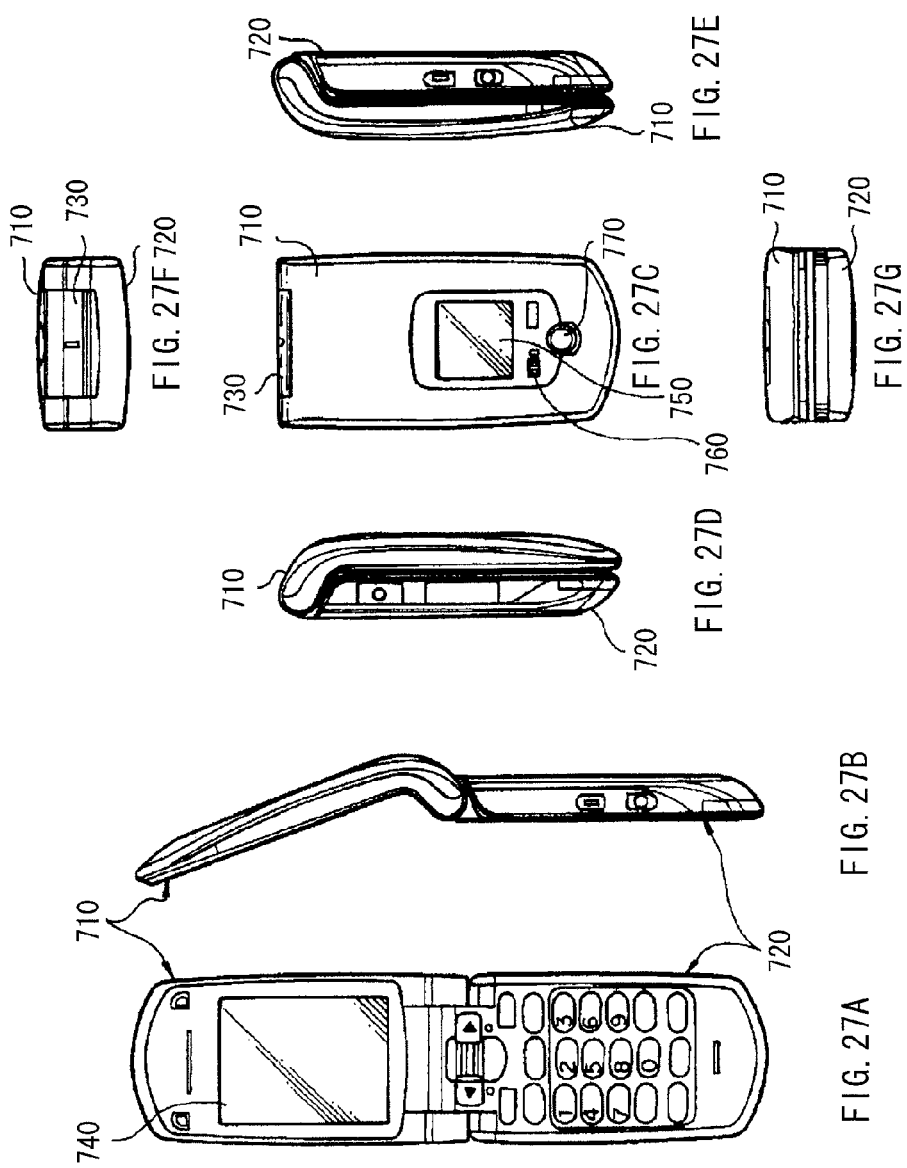

DISPLAY PANEL, DISPLAY, AND ELECTRONIC UNIT HAVING OPENINGS ARRANGED IN A CLOSE PACKING MANNER

BACKGROUND

The present technology relates to a display panel including a self-luminous device such as an organic electro luminescence (EL) device, and a display and an electronic unit which are equipped with such a display panel.

In the field of displays for displaying images, recently, displays which include a current-driven type optical device as a light-emitting device for each pixel have been developed and prepared for the markets (for example, see Japanese Unexamined Patent Application Publication No. 2008-83272). Such a current-driven type optical device varies luminance thereof according to a current flowing therethrough, and an organic EL device is given as one example. An organic EL device is a self-luminous device, unlike a liquid crystal device and the like. Therefore, since operating without a light source (backlight), a display including an organic EL device (or an organic EL display) provides higher image visibility, lower power consumption, and a faster device response than a liquid crystal display equipped with a light source.

Various studies for organic EL displays have been ever conducted, for the purpose of improving the luminance while suppressing the increase in the power consumption. For instance, a technique has been proposed, in which reflectors of an inverted truncated-conical shape are provided on the light extraction side of an organic EL device (for example, see Japanese Unexamined Patent Application Publication No. 2011-23240). In the organic EL display provided with the reflector, light that has been emitted from the organic EL devices in an oblique direction is reflected in the vertical direction by the reflectors.

SUMMARY

In the above-described technique described in Japanese Unexamined Patent Application Publication No. 2011-23240, the sparsely arranged reflectors decrease the opening ratio, which may cause a disadvantage of increasing the power consumption, and lowering the panel quality, for example, by causing burn-in on the panel.

There is a need for a display panel having a high opening ratio, and a display and an electronic unit which include this display panel.

According to an embodiment of the present technology, there is provided a display panel including a unit for each sub-pixel, the unit including a plurality of openings, the unit having an array structure in which the openings are arranged in a close packing manner. In the array structure of the unit, when a single virtual opening is placed within a peripheral region of the unit, and a center of the virtual opening and centers of a plurality of openings located adjacent to the virtual opening are connected to one another by straight lines, only one basic figure for the arrangement in the close packing manner is created but two basic figures therefor are not created.

According to an embodiment of the present technology, there is provided a display including a display panel and a drive circuit driving the display panel. The display panel includes a unit for each sub-pixel. The unit includes a plurality of openings, and the unit has an array structure in which the openings are arranged in a close packing manner In the array structure of the unit, when a single virtual opening is placed within a peripheral region of the unit, and a center of the virtual opening and centers of a plurality of openings located adjacent to the virtual opening are connected to one another by straight lines, only one basic figure for the arrangement in the close packing manner is created but two basic figures therefor are not created.

According to an embodiment of the present technology, there is provided an electronic unit with a display. The display includes a display panel and a drive circuit driving the display panel. The display panel includes a unit for each sub-pixel, the unit including a plurality of openings, and the unit has an array structure in which the openings are arranged in a close packing manner. In the array structure of the unit, when a single virtual opening is placed within a peripheral region of the unit, and a center of the virtual opening and centers of a plurality of openings located adjacent to the virtual opening are connected to one another by straight lines, only one basic figure for the arrangement in the close packing manner is created but two basic figures therefor are not created.

In each of the display panel, the display, and the electronic unit, the plurality of openings that are arranged in the close packing manner constitute the array structure in which when a single virtual opening is placed within the peripheral region of the unit, and a center of the virtual opening and centers of a plurality of openings located adjacent to the virtual opening are connected to one another by straight lines, only one basic figure for the arrangement in the close packing manner is created but two basic figures therefor are not created. Due to this structure, since the unit has, for example, a hexagonal, trapezoidal, or inclined quadrangular shape, the arrangement loss of the openings is minimized when a reflective electrode has a planar shape corresponding to that of the unit.

Meanwhile, it is assumed a case where a plurality of openings that are arranged in a close packing manner constitute an array structure in which when a single virtual opening is placed within a peripheral region of a unit, and a center of the virtual opening and centers of a plurality of openings located adjacent to the virtual opening are connected to one another by straight lines, two basic figures for the arrangement in the close packing manner are created. In this structure, the arrangement loss of the openings possibly occurs when the unit has, for example, a hexagonal, trapezoidal, or inclined quadrangular shape.

The display panel, the display, and the electronic unit according to the embodiments of the present technology are configured to minimize the arrangement loss of the openings, thus making it possible to increase the opening ratio.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 27A is an elevation view of Application Example 5 in the opened state, FIG. 27B is a side view thereof, FIG. 27C is an elevation view of Application Example 5 in the closed state, and FIG. 27D to 27G are a left side view, a right side view, a top view, and a bottom view of Application Example 5 illustrated in FIG. 15C, respectively.

DETAILED DESCRIPTION

Hereinafter, an embodiment of the present technology will be described in detail, with reference to the accompanying drawings. Note that descriptions will be given in the following order.
1. Embodiment
  An example of a layout of reflectors so as to minimize the arrangement loss thereof.
2. Module and Application Examples
[1. Embodiment]
(Configuration)

Figure 1:
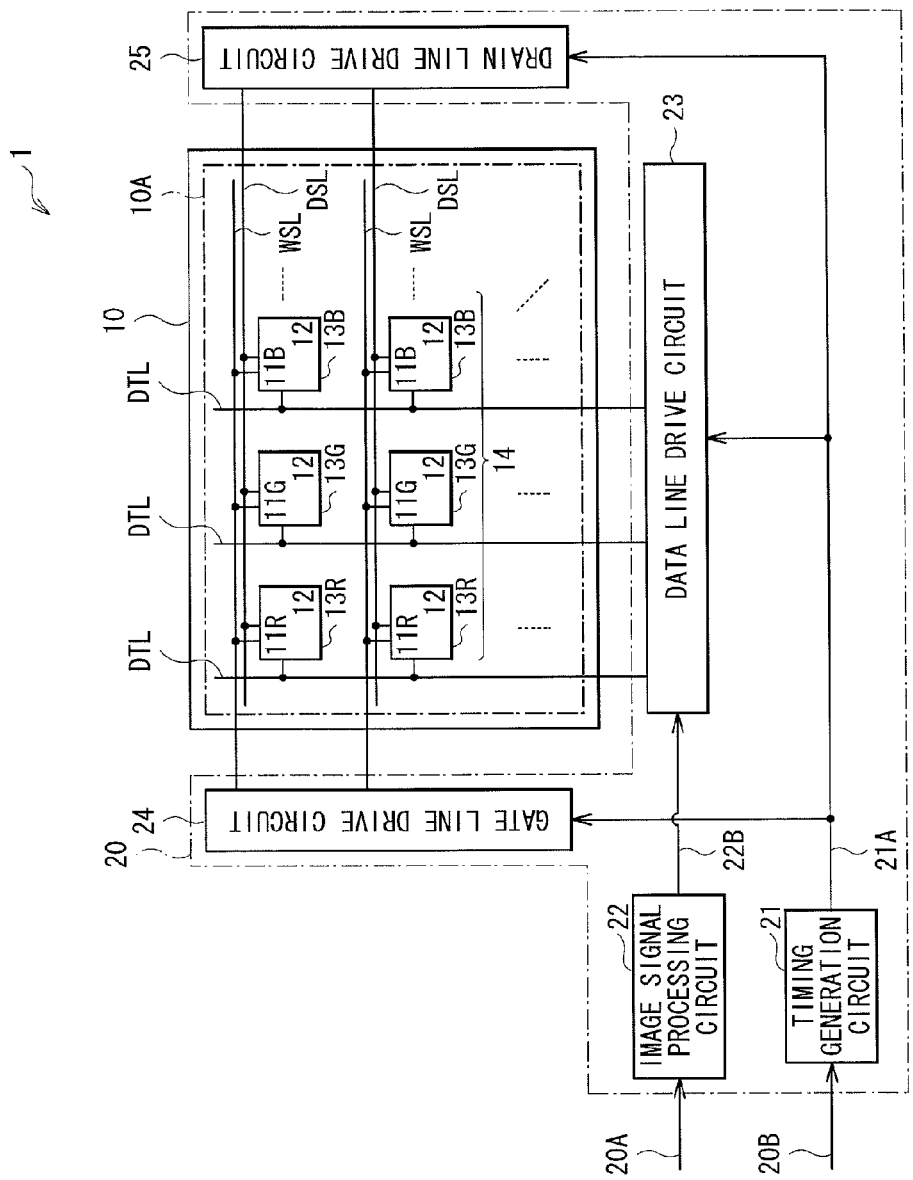
FIG. 1 is a view illustrating an example of a configuration of a display according to an embodiment of the present technology.

FIG. 1 is a view illustrating an example of an overall configuration of a display 1 according to an embodiment of the present technology. This display 1 includes a display panel 10 and a drive circuit 20 that drives the display panel 10.

The display panel 10 has a display region 10A in which a plurality of display pixels 14 are arranged two-dimensionally. This display panel 10 drives the individual display pixels 14 in an active matrix manner, in order to display an image according to an image signal 20A to be input from the exterior. Each display pixel 14 includes a red sub-pixel 13R, a green sub-pixel 13G, and a blue sub-pixel 13B. Note that any of the sub-pixels 13R, 13G, and 13B will be called collectively as a "sub-pixel 13", hereinafter.

Figure 2:
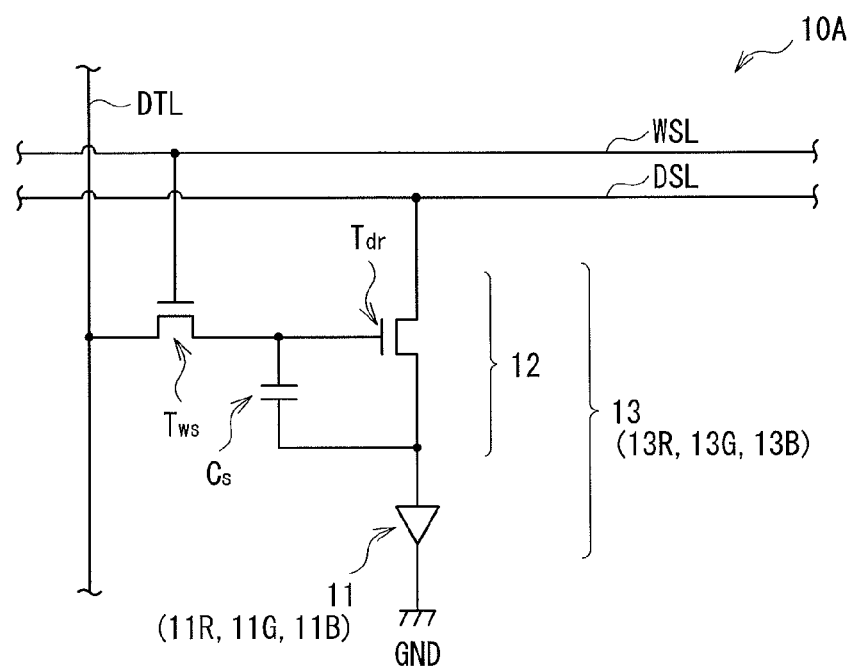
FIG. 2 is a view illustrating an example of a circuit configuration of a sub-pixel illustrated in FIG. 1.

FIG. 2 is a view illustrating an example of a circuit configuration of one sub-pixel 13. This sub-pixel 13 includes an organic EL device 11 and a pixel circuit 12 that drives the organic EL device 11, as illustrated in FIG. 2. In this embodiment, one sub-pixel 13R is provided with an organic EL device 11R that emits red EL light, as an organic EL device 11. Likewise, one sub-pixel 13G is provided with an organic EL device 11G that emits green EL light, as an organic EL device 11, and one sub-pixel 13B is provided with an organic EL device 11B that emits blue EL light, as an organic EL device 11.

The pixel circuit 12 includes, for example, a write transistor Tws, a drive transistor Tdr, and a retentive capacitor Cs, that is, has a circuit configuration of 2Tr1C. Note that the circuit configuration of the pixel circuit 12 is not limited to 2Tr1C. Alternatively, the pixel circuit 12 may include two write transistors Tws that are connected in series to each other, transistors other than the above ones, or a capacitor.

The write transistor Tws is a transistor that writes a voltage corresponding to the image signal 20A into the retentive capacitor Cs. The drive transistor Tdr is a transistor that drives the organic EL device 11, based on the voltage having been written into the retentive capacitor Cs by the write transistor Tws. Each of the write transistor Tws and the drive transistor Tdr may be composed of, for example, an n-channel MOS thin film transistor (TFT). Alternatively, each of the write transistor Tws and the drive transistor Tdr may be composed of a p-channel MOS TFT.

The drive circuit 20 includes a timing generation circuit 21, an image signal processing circuit 22, a data line drive circuit 23, a gate line drive circuit 24, and a drain line drive circuit 25. In addition, the drive circuit 20 includes data lines DTL connected to the output of the data line drive circuit 23, gate lines WSL connected to the output of the gate line drive circuit 24, and drain lines DSL connected to the output of the drain line drive circuit 25. Furthermore, the drive circuit 20 includes a ground line GND (see FIG. 2) connected to a cathode of the organic EL device 11. Note that the ground line GND is connected to the ground, and has a ground potential by being connected thereto.

The timing generation circuit 21 controls the data line drive circuit 23, the gate line drive circuit 24, and the drain line drive circuit 25 to operate, for example, in relation to one another. This timing generation circuit 21 outputs a control signal 21A to these circuits, for example, in response to (or in synchronization with) a synchronization signal 20B input from the exterior.

The image signal processing circuit 22 corrects, for example, a digital image signal 20A input from the exterior, and converts the corrected image signal into an analog signal voltage 22B, then outputting this signal voltage 22B to the data line drive circuit 23.

The data line drive circuit 23 writes the analog signal voltage 22B received from the image signal processing circuit 22 into display pixels 14 (or sub-pixels 13) to be selected via corresponding data lines DTL, in response to (or in synchronization with) the input of the control signal 21A. The data line drive circuit 23 may output, for example, the signal voltage 22B and a constant voltage that is independent of the image signal 20A.

The gate line drive circuit 24 sequentially selects a plurality of display pixels 14 (or sub-pixels 13) for each gate line WSL by sequentially applying selection pluses to a plurality of gate lines WSL, in response to (or in synchronization with) the input of the control signal 21A. For example, the gate line drive circuit 24 may output respective voltages for turning on and off the write transistor Tws.

The drain line drive circuit 25 outputs a predetermined voltage to a drain of the transistor Tdr in each of the pixel circuits 12 via a corresponding drain line DSL, in response to (or in synchronization with) the input of the control signal 21A. For example, the drain line drive circuit 25 may output respective voltages to light and stop lighting the organic EL device 11.

Next, a description will be given of the connection relationship and arrangement of individual components, with reference to FIG. 2. The gate line WSL is formed extending along a row direction, and is connected to a gate of the write transistor Tws. The drain line DSL is also formed extending along the row direction, and is connected to the drain of the drive transistor Tdr. The data line DTL is formed extending along a column direction, and is connected to a drain of the write transistor Tws.

A source of the write transistor Tws is connected to a gate of the drive transistor Tdr and a first end of the retentive capacitor Cs. A source of the drive transistor Tdr and a second end of the retentive capacitor Cs (terminal not connected to the write transistor Tws) are connected to an anode of the organic EL device 11. The cathode of the organic EL device 11 is connected to the ground line GND. For example, the cathode may be formed on an overall surface of the display region 10A.

Figure 3:
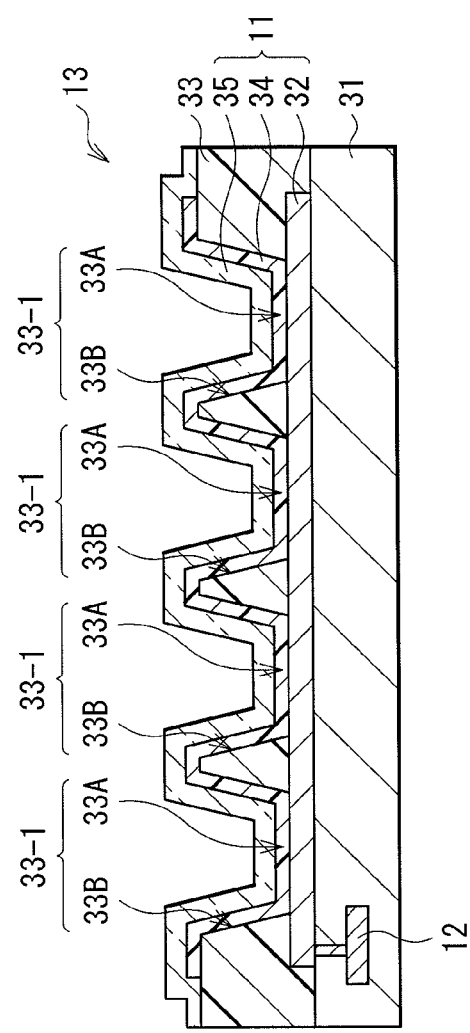
FIG. 3 is a view illustrating an example of a cross-sectional configuration of the sub-pixel illustrated in FIG. 1.

Next, a description will be given of a cross-sectional configuration of the organic EL device 11 and a surrounding region thereof in the sub-pixel 13, with reference to FIG. 3. FIG. 3 illustrates an example of the cross-sectional configuration of the sub-pixel 13.

Referring to the organic EL device 11 and the surrounding region thereof illustrated in FIG. 3, for example, the sub-pixel 13 includes the organic EL device 11 on a circuit substrate 31 formed with the pixel circuit 12. The organic EL device 11 has a structure in which an organic layer 34 is sandwiched by a reflective electrode 32 and a transparent electrode 35. The reflective electrode 32 is formed on a side closer to the circuit substrate 31 of the organic layer 34, and functions as, for example, an anode electrode of the organic EL device 11. This reflective electrode 32 is made of a metal material, and also functions as a reflection mirror. Meanwhile, the transparent electrode 35 is formed on a side farther from the circuit substrate 31 of the organic layer 34, and also functions as, for example, a cathode electrode of the organic EL device 11. The transparent electrode 35 is made of a conductive material that is transparent to visible light, such as ITO. The organic layer 34 includes, for example, a hole-injection layer that increases the efficiency of injecting holes, a hole transport layer that increases the efficiency of transporting holes to a light emitting layer, the light emitting layer that emits light by recombination of electrons and holes, and an electron transport layer that increases the efficiency of transporting electrons to the light emitting layer, in this order from the side of the reflective electrode 32. With the above configuration of the sub-pixel 13, light that has been emitted from the organic layer 34 in the organic EL device 11 is output to the exterior through the transparent electrode 35, or is reflected by the reflective electrode 32, and is then output to the exterior through the organic layer 34 and the transparent electrode 35. Moreover, the sub-pixel 13 is configured to reflect, by the reflection structures 33-1 (described later) provided therein, the light emitted from the organic layer 34 in the organic EL device 11, and then output to the exterior through the organic layer 34 and the transparent electrode 35. Thus, the sub-pixel 13 employs the top emission structure.

Figure 4:
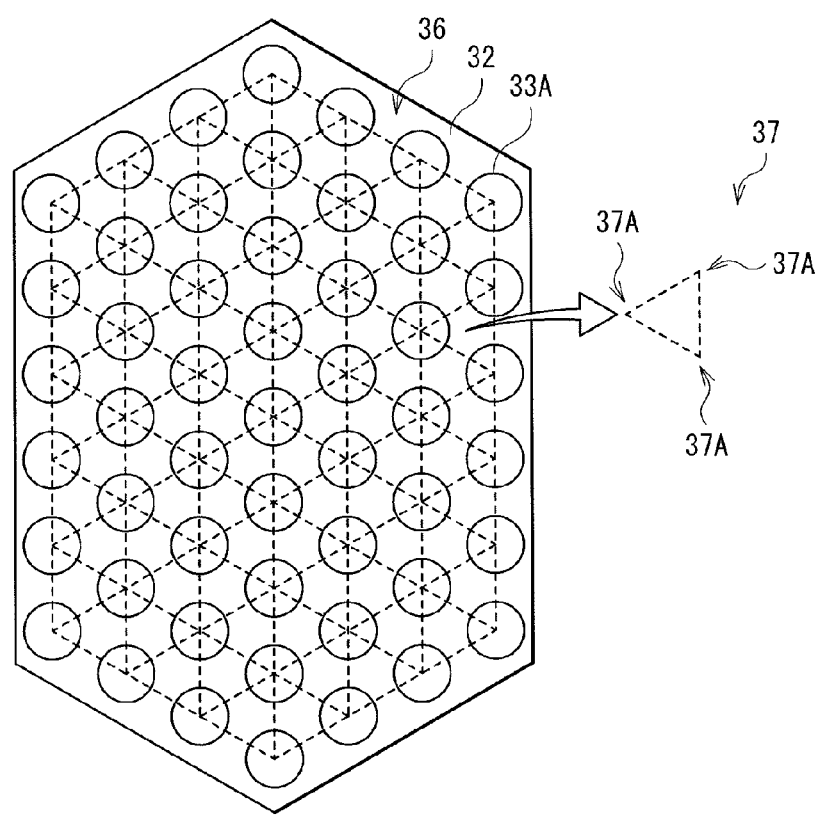
FIG. 4 is a view illustrating an example of a layout of openings within the sub-pixel illustrated in FIG. 1.

The sub-pixel 13 further includes the plurality of reflection structures 33-1 that decrease a divergence angle of light emitted from the organic EL device 11, for example, as illustrated in FIG. 3. Each reflection structure 33-1 is formed in a corresponding through-hole that is formed above the reflective electrode 32 and passes through a resin layer 33. Thus, each through-hole constitutes the reflection structure 33-1. Each reflection structure 33-1 (or each through-hole) includes an opening 33A and a reflection surface 33B that reflects light emitted from the organic EL device 11. The opening 33A has a point-symmetrical shape, such as a circular shape as illustrated in FIG. 4. Accordingly, when the opening 33A is circular, the reflection structure 33-1 has an inverted truncated-conical shape.

The reflection structures 33-1 are formed on the upper surface of the reflective electrode 32 while being in contact with this upper surface. In addition, the openings 33A are formed above the upper surface of the reflective electrode 32. Thus, the reflective electrode 32 is exposed from the bottoms of the openings 33A. The organic layer 34 is formed at least in the bottom of each opening 33A (or on the upper surface of the reflective electrode 32). Specifically, the organic layer 34 may be formed throughout the bottom and inner side (or the reflection surface 33B) of each opening 33A, for example, as illustrated in FIG. 3. The transparent electrode 35 is formed at least in the bottom of each opening 33A while being in contact with the upper surface of the organic layer 34. In addition, the transparent electrode 35 is formed to cover the organic layer 34, and for example, may be formed throughout the display region 10A.

Next, a description will be given of a layout of the openings 33A within the sub-pixel 13, with reference to FIG. 4. FIG. 4 is a view illustrating an example of a layout of the openings 33A within the sub-pixel 13.

Figure 5:
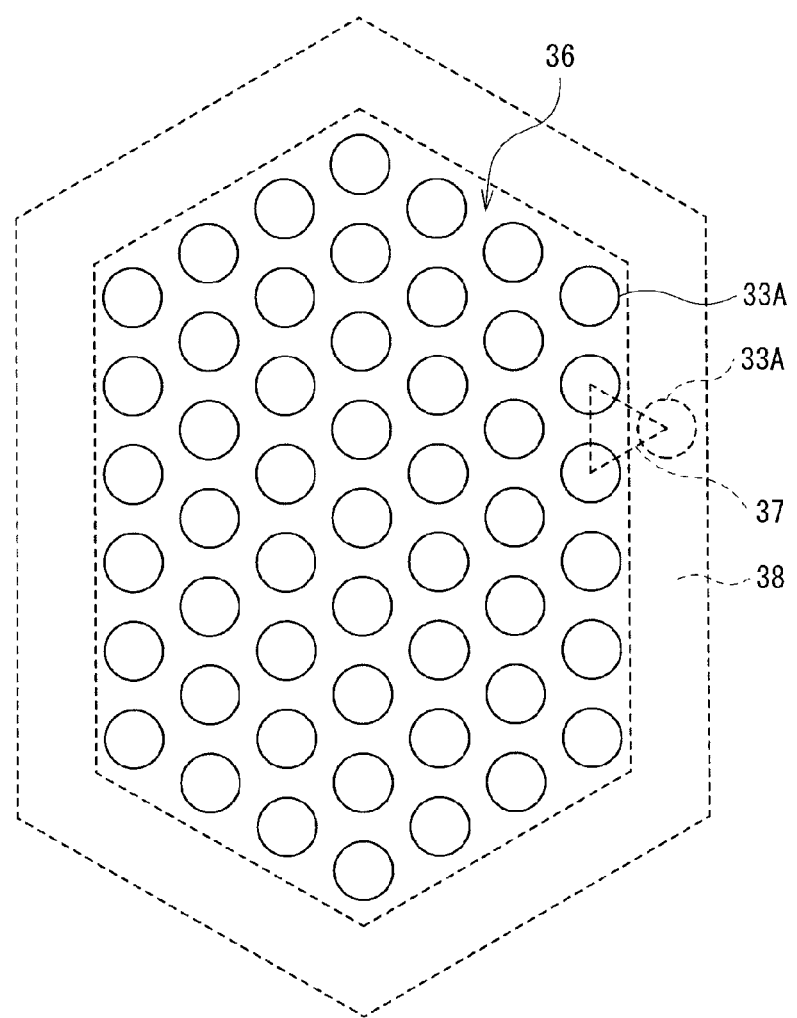
FIG. 5 is a view illustrating a state where a virtual opening is provided within a peripheral region of a unit illustrated in FIG. 3.

As illustrated in FIG. 4, the plurality of openings 33A within the sub-pixel 13 constitute a unit 36. This unit 36 has an array structure in which the openings 33A are arranged in a close packing manner. Furthermore, for example, as illustrated in FIG. 5, in the array structure of the unit 36, when a single virtual opening 33A is placed within a peripheral region 38 of the unit 36, and the center of the virtual opening 33A and the centers of a plurality of openings 33A located adjacent to the virtual opening 33A are connected to one another by straight lines (dotted line), only one basic FIG. 37 for the arrangement in the close packing manner is created but two basic figures therefor are not created. The basic FIG. 37 has a triangular shape, for example, as illustrated in FIG. 4. The center of each opening 33A contained in the unit 36 is positioned at any of the apexes 37A of a corresponding basic FIG. 37 (triangle), for example, as illustrated in FIG. 4. In this case, this triangle is a regular triangle having apex angles of approximately 60 degrees, for example, as illustrated in FIG. 4. As is well known, and as illustrate in at least basic FIG. 37, a triangle has three vertices. Further, as illustrated in FIG. 4 and basic FIG. 37, the triangle may have vertices formed by centers of at least two openings and a center of the virtual opening. That is, the triangle may have at least one vertex formed in the peripheral region of the unit.

The reflective electrode 32 has a planar shape corresponding to that of the unit 36. Specifically, the reflective electrode 32 has a shape analogous to the planar shape of the unit 36. This reflective electrode 32 has an area greater than that of the unit 36. As illustrated in FIG. 4, for example, in the case where the unit 36 has a hexagonal shape, the reflective electrode 32 has a hexagonal shape whose area is greater than that of the unit 36.

Figure 6:
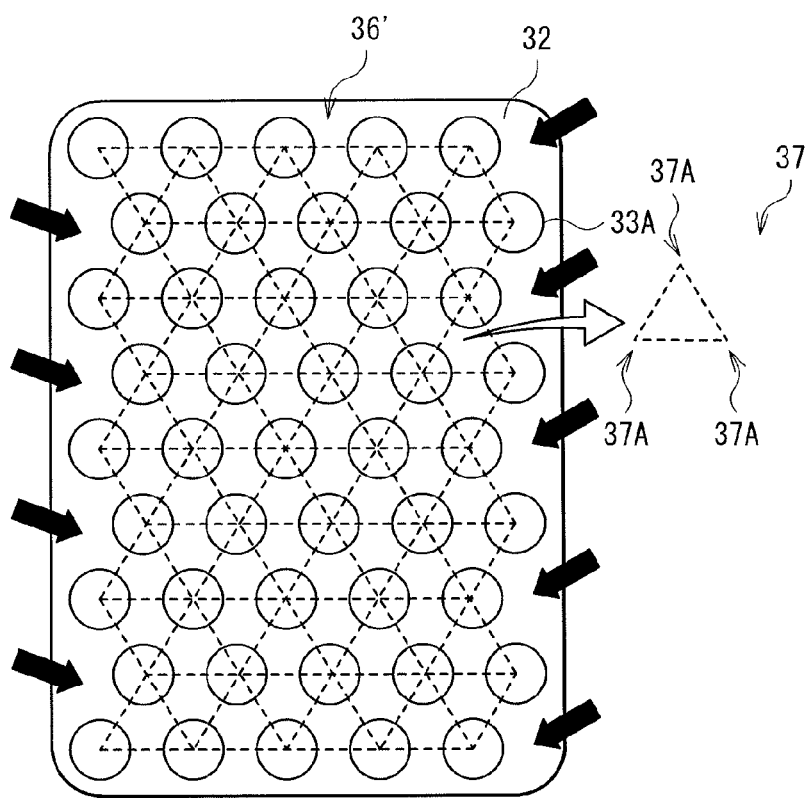
FIG. 6 is a view illustrating an example of a layout of openings within a sub-pixel according to a reference example.
Figure 7:
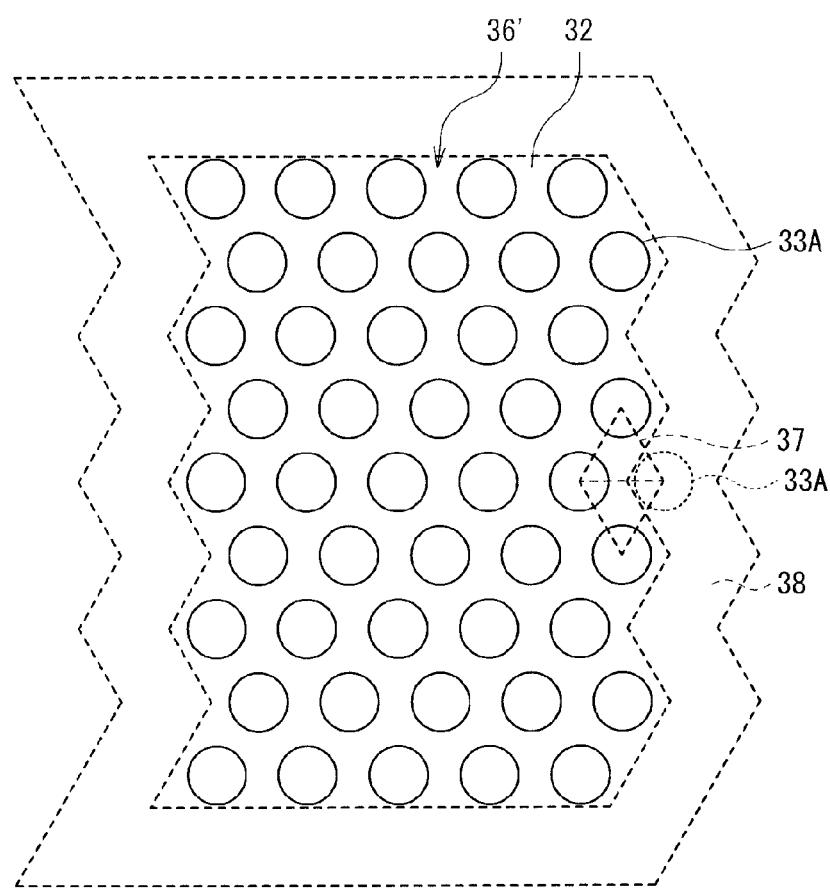
FIG. 7 is a view illustrating a state where a virtual opening is provided within a peripheral region of a unit illustrated in FIG. 6.

Meanwhile, in a reference example illustrated in FIGS. 6 and 7, a unit 36' containing a plurality of openings 33A arranged in a close packing manner has an array structure in which when a single virtual opening 33A is placed within a peripheral region 38 of the unit 36', and the center of the virtual opening 33A and the centers of a plurality of openings 33A located adjacent to the virtual opening 33A are connected to one another by straight lines (dotted line), two basic FIG. 37 for the arrangement in the close packing manner are created. As described above, there is a commonality between the units 36 and 36' in that the plurality of openings 33A is arranged in a close packing manner. However, for the unit 36', in the case where a polygonal shape without any depression, such as a rectangular shape, is used as a shape of the reflective electrode 32, the arrangement loss of the openings 33A possibly occurs, as illustrated in FIG. 6 (note that the arrangement loss occurs in regions designated by thick arrows in the figure). In contrast, for the unit 36, in the case where a polygonal shape without any depression, such as a hexagonal shape, is used as a shape of the reflective electrode 32, the arrangement loss of the openings 33A is minimized, as illustrated in FIG. 4. As a result, the opening ratio of this embodiment becomes greater than that of the reference example by an overall area saved by minimizing the arrangement loss in the above manner.

Figure 8:
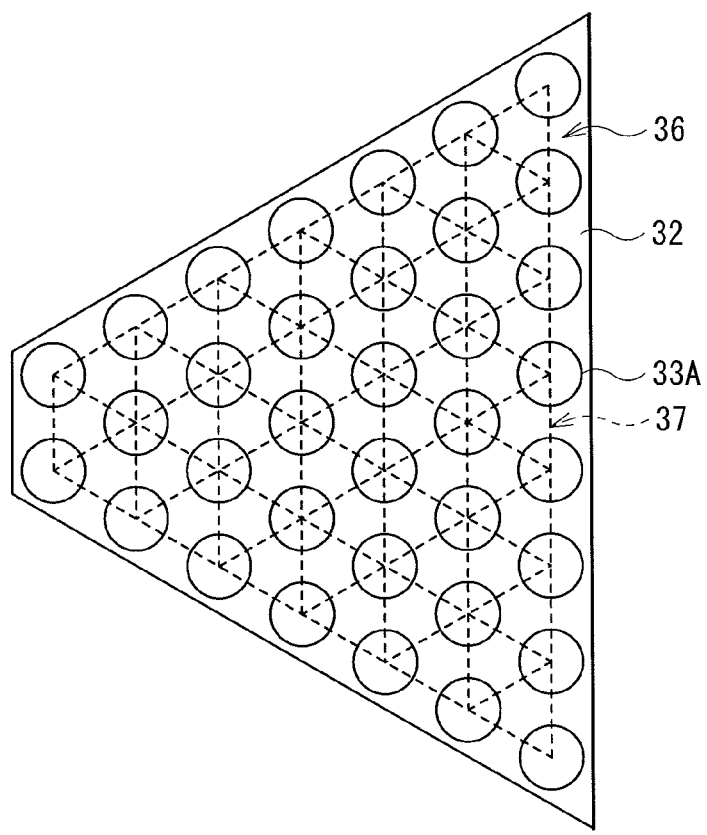
FIG. 8 is a view illustrating Modification Example 1 of a layout of openings within the sub-pixel illustrated in FIG. 1.

The unit 36 may have any given shape, in addition to a hexagonal shape. For example, the unit 36 may have a trapezoidal shape that is one example of polygonal shapes without any depression, as illustrated in FIG. 8. The orientation of this trapezoidal shape is not particularly limited. For example, the upper side of the trapezoidal shape may be oriented toward the left as illustrated in FIG. 8 or toward the right (not illustrated). In this case, the reflective electrode 32 has a trapezoidal shape whose area is greater than that of the unit 36.

Figure 9:
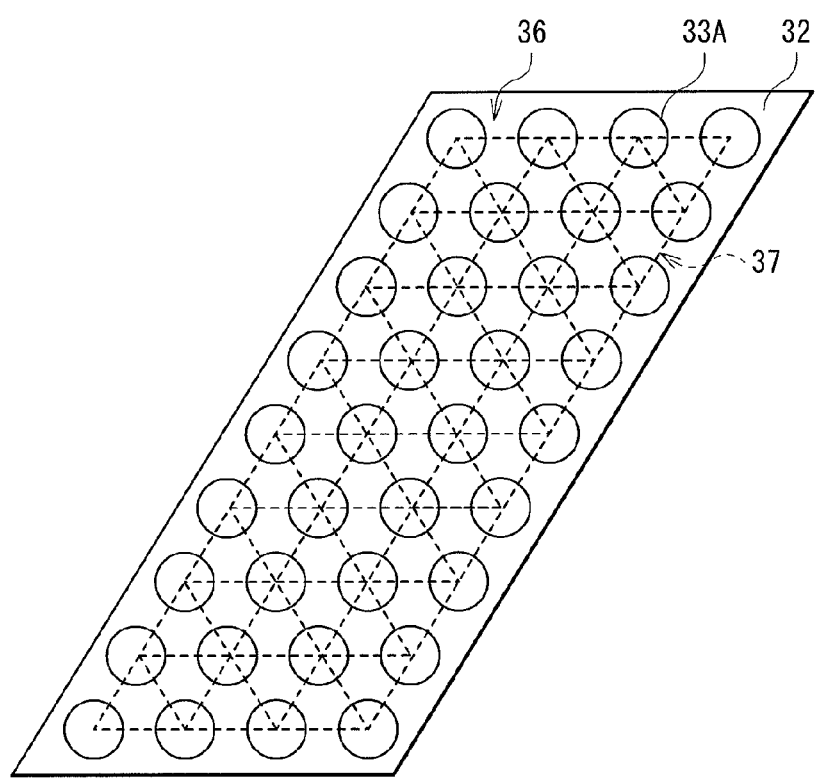
FIG. 9 is a view illustrating Modification Example 2 of a layout of openings within the sub-pixel illustrated in FIG. 1.

Moreover, the unit 36 may also have an inclined quadrangular shape that is one example of a polygonal shape without any depression, for example, as illustrated in FIG. 9. The direction in which this quadrangular shape is inclined is not particularly limited. For example, the quadrangular shape may be inclined toward the right as illustrated in FIG. 9 or toward the left (not illustrated). In this case, the reflective electrode 32 has a quadrangular shape whose area is greater than that of the unit 36.

Figure 10:
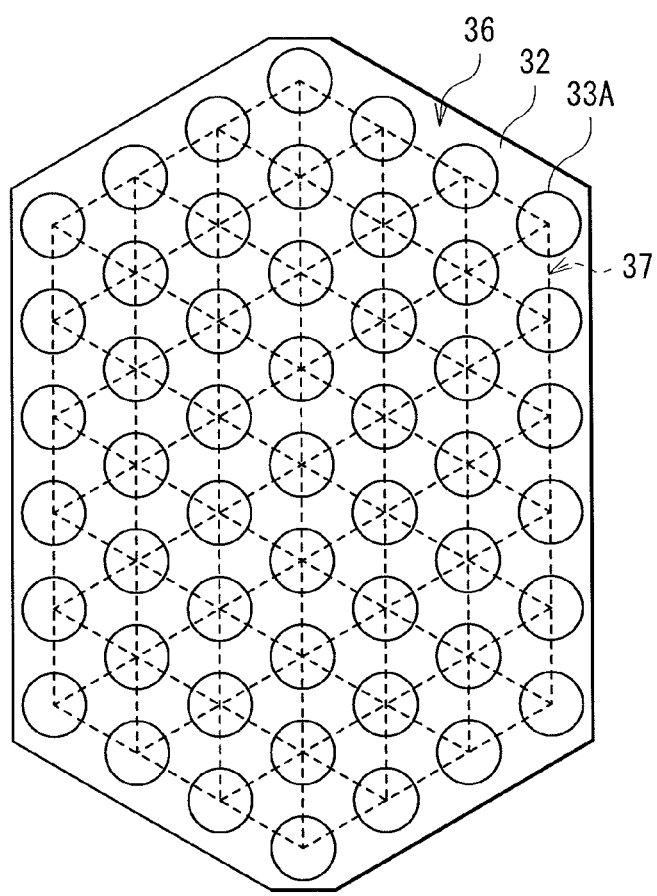
FIG. 10 is a view illustrating Modification Example 3 of a layout of openings within the sub-pixel illustrated in FIG. 1.
Figure 11:
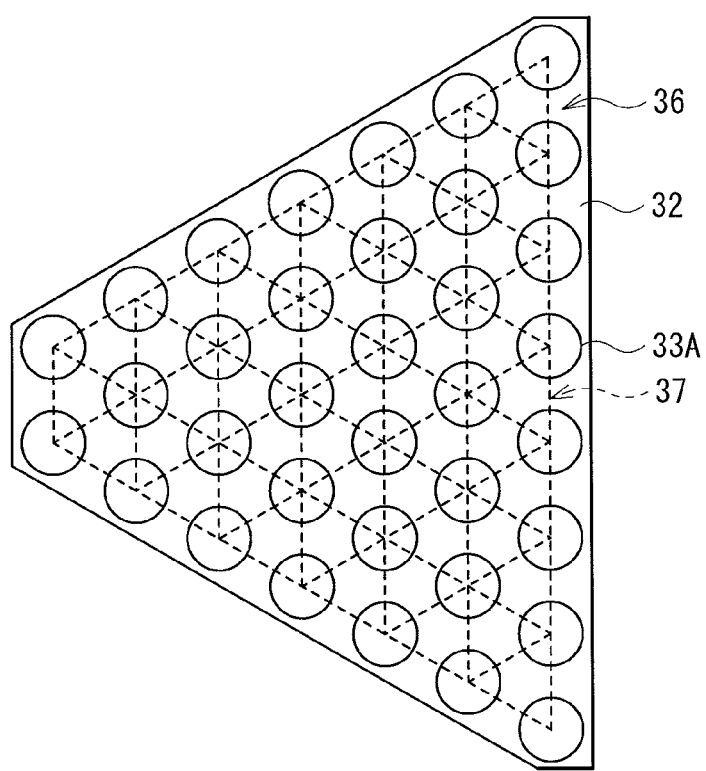
FIG. 11 is a view illustrating Modification Example 4 of a layout of openings within the sub-pixel illustrated in FIG. 1.
Figure 12:
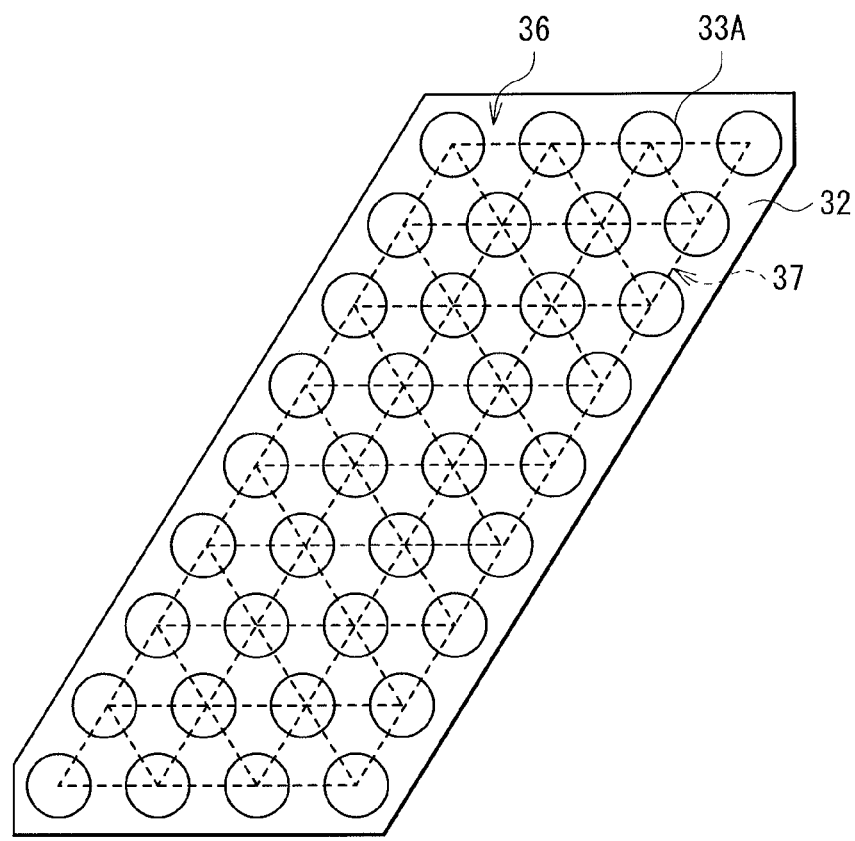
FIG. 12 is a view illustrating Modification Example 5 of a layout of openings within the sub-pixel illustrated in FIG. 1.

In the case where the unit 36 has a hexagonal shape, the reflective electrode 32 may have a shape formed by cutting away one or more angles from a hexagon such as an octagonal shape, for example, as illustrated in FIG. 10. In addition, in the case where the unit 36 has a trapezoidal shape, the reflective electrode 32 may have a shape formed by cutting away one or more angles from a trapezoid such as a hexagonal shape, for example, as illustrated in FIG. 11. In addition, in the case where the unit 36 has an inclined quadrangular shape, the reflective electrode 32 may have a shape formed by cutting away one or more angles from an inclined quadrangle such as a hexagonal shape, for example, as illustrated in FIG. 12.

Figure 13:
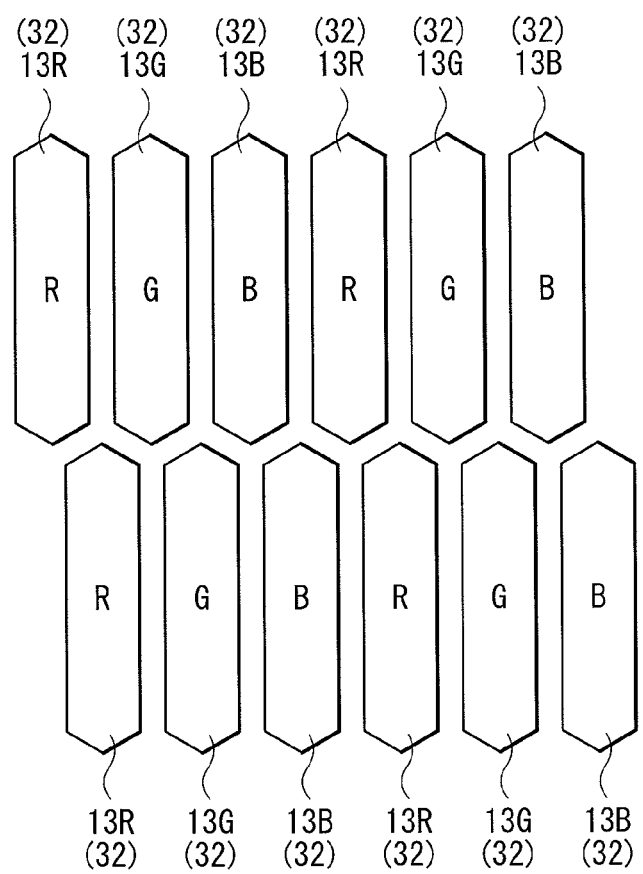
FIG. 13 is a view illustrating an example of a layout of the sub-pixels, when a layout of openings within a sub-pixel is as illustrated in FIG. 4 or 10.

Next, a description will be given of a layout of sub-pixels 13 within a plane, with reference to FIG. 13. FIG. 13 illustrates an example of a layout of sub-pixels 13 within a plane.

Each sub-pixel 13 has a planar shape corresponding to that of each reflective electrode 32. In the case where each shape of the reflective electrodes 32 and the sub-pixels 13 is a band-shaped hexagon or is analogous thereto, the sub-pixels 13 are laid out so as to be shifted by a half-pitch thereof per row, for example, as illustrated in FIG. 13. In this case, red sub-pixels 13R are arranged in a staggered (or zigzag) fashion with amplitude of one pitch thereof along each of corresponding columns. Likewise, green sub-pixels 13G are also arranged in a staggered (or zigzag) fashion with amplitude of one pitch thereof along each of corresponding columns, and blue sub-pixels 13B are also arranged in a staggered (or zigzag) fashion with amplitude of one pitch thereof along each of corresponding columns.

Figure 14:
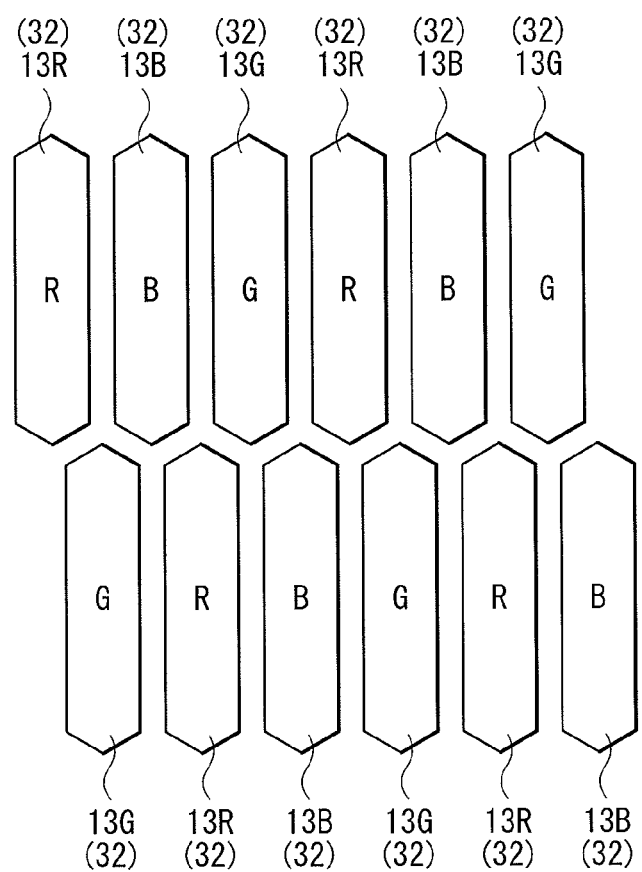
FIG. 14 is a view illustrating Modification Example 1 of a layout of the sub-pixels, when a layout of openings within a sub-pixel is as illustrated in FIG. 4 or 10.

In the case where each shape of the reflective electrodes 32 and the sub-pixels 13 is a band-shaped hexagon or is analogous thereto, the respective sub-pixels 13R, 13G, and 13B may be arranged so as to be laid out in a triangular fashion (or in a deltaic array), for example, as illustrated in FIG. 14.

Figure 15:
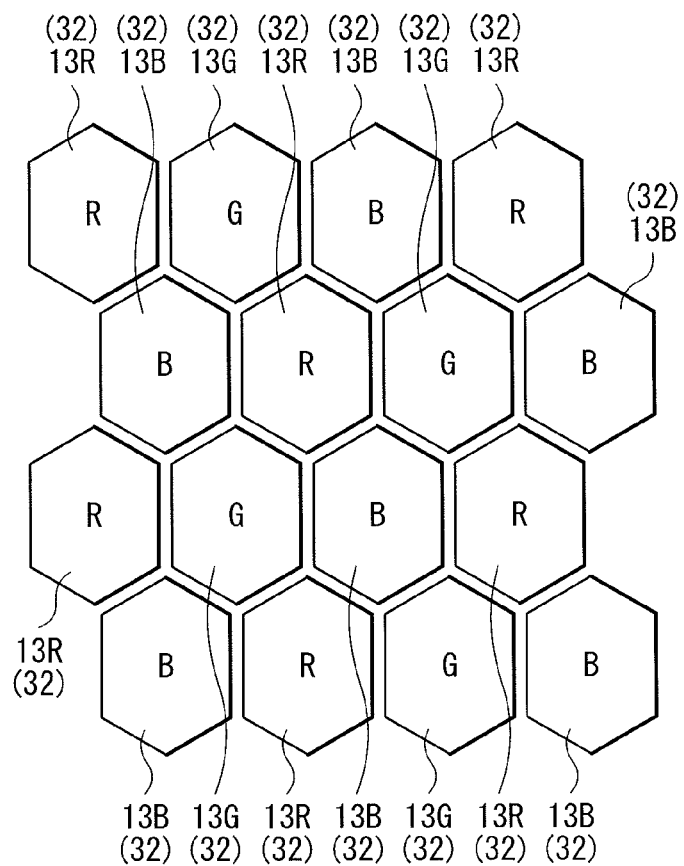
FIG. 15 is a view illustrating Modification Example 2 of a layout of the sub-pixels, when a layout of openings within a sub-pixel is as illustrated in FIG. 4 or 10.

In the case where each shape of the reflective electrodes 32 and the sub-pixels 13 is a regular hexagon or is analogous thereto, the respective sub-pixels 13R, 13G, and 13B may be arranged so as to be laid out in a triangular fashion (or in a deltaic array), for example, as illustrated in FIG. 15.

Figure 16:
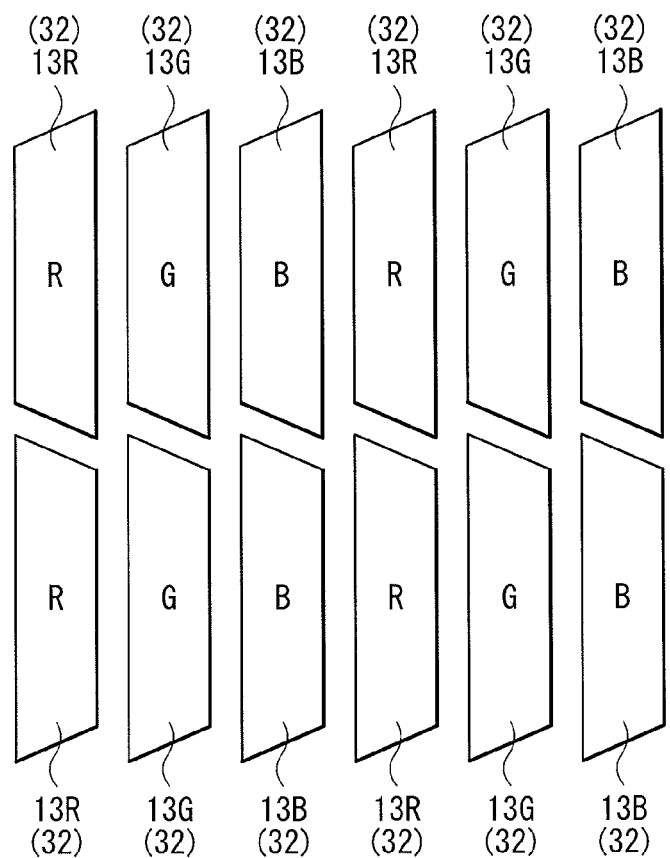
FIG. 16 is a view illustrating an example of a layout of the sub-pixels, when a layout of openings within a sub-pixel is as illustrated in FIG. 8 or 11.

In the case where each shape of the reflective electrodes 32 and the sub-pixels 13 is a trapezoid or is analogous thereto, the respective sub-pixels 13R, 13G, and 13B may be arranged in a stripe-like fashion, for example, as illustrated in FIG. 16. In this case, the red sub-pixels 13R are arranged along each of corresponding columns, such that the trapezoids therefor are oriented in directions opposite to one another in adjacent rows. Likewise, the green sub-pixels 13G are also arranged along each of corresponding columns, such that the trapezoids therefor are oriented in directions opposite to one another in adjacent rows, and the blue sub-pixels 13B are also arranged along each of corresponding columns, such that trapezoids therefor are oriented in directions opposite to one another in adjacent rows. Note that all the trapezoids arranged along each row are oriented in the same direction.

Figure 17:
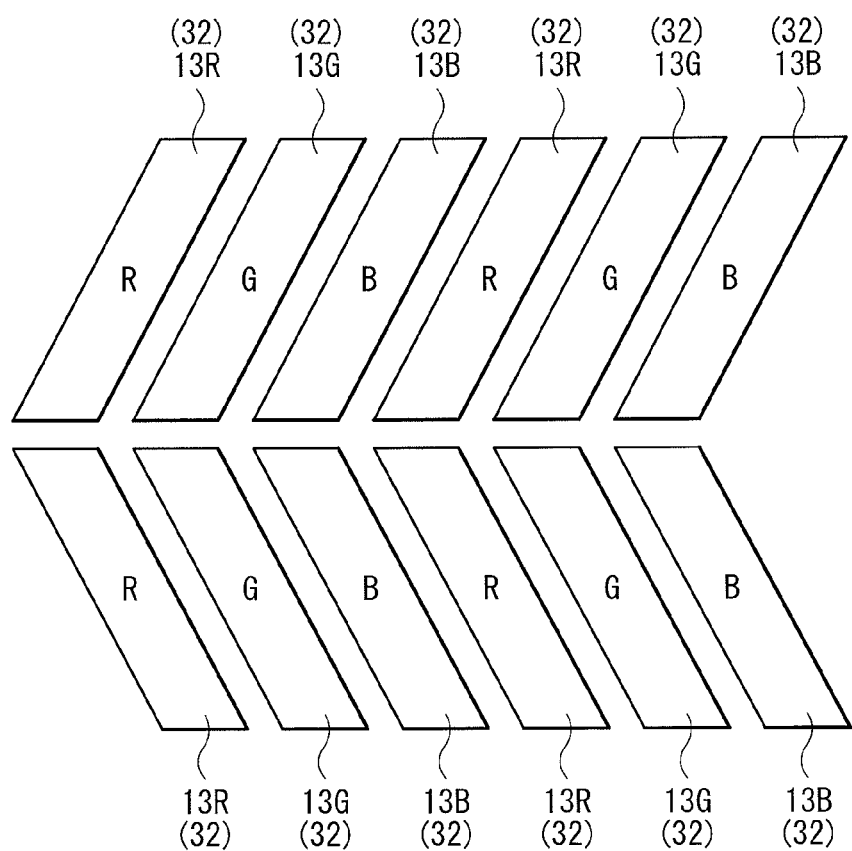
FIG. 17 is a view illustrating an example of a layout of the sub-pixels, when a layout of openings within a sub-pixel is as illustrated in FIG. 9 or 12.

In the case where each shape of the reflective electrodes 32 and the sub-pixels 13 is an inclined quadrangle or is analogous thereto, the respective sub-pixels 13R, 13G, and 13B may be arranged in a stripe-like fashion, for example, as illustrated in FIG. 17. In this case, the red sub-pixels 13R are arranged along each of corresponding columns, such that the inclined directions thereof are opposite to one another in adjacent rows. Likewise, the green sub-pixels 13G are arranged along each of corresponding columns, such that the inclined directions thereof are opposite to one another in adjacent rows, and the blue sub-pixels 13B are arranged along each of corresponding columns, such that the inclined directions thereof are opposite to one another in adjacent rows. Note that all the inclined directions of the quadrangles arranged along each row are the same as one another.

Figure 18:
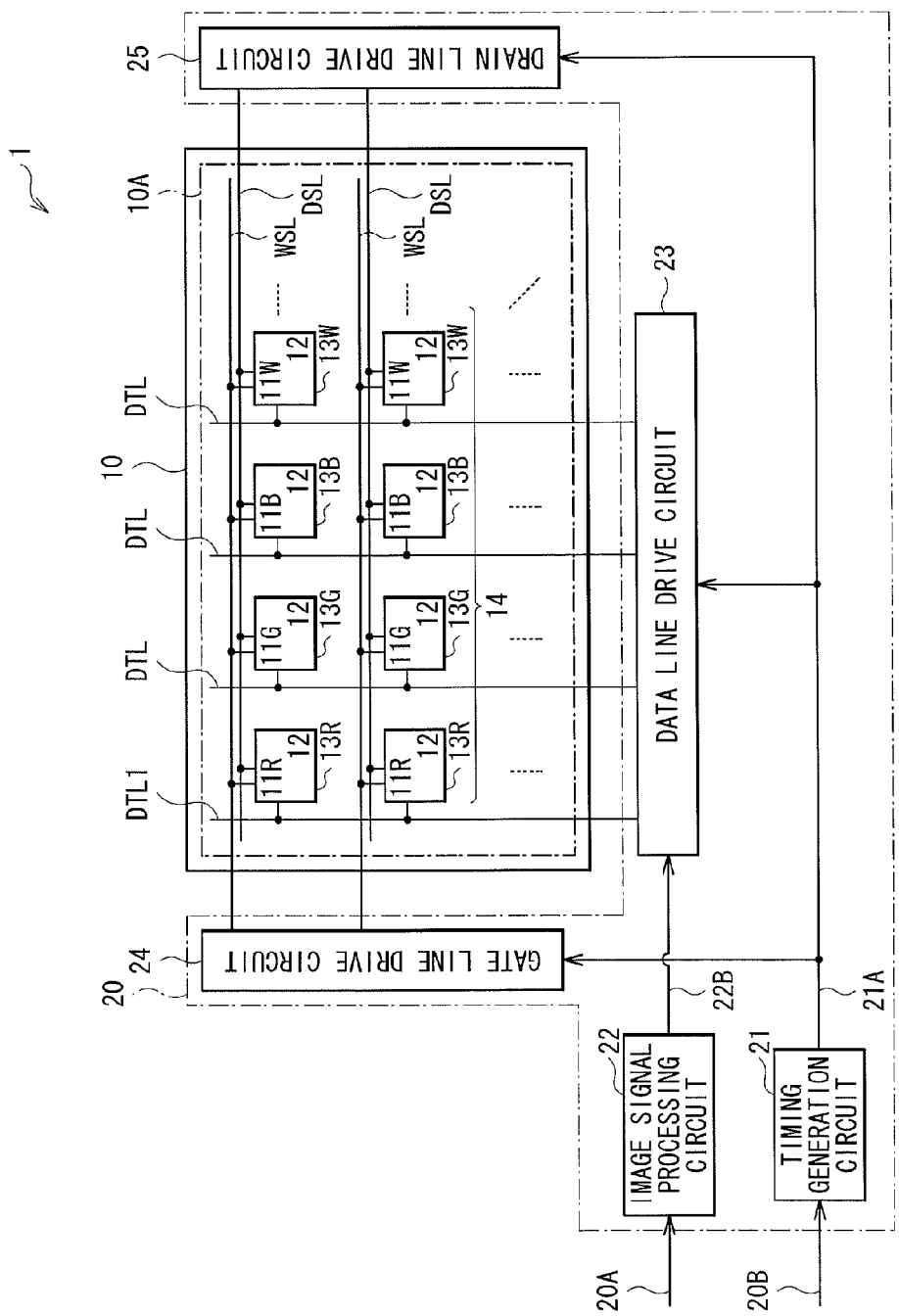
FIG. 18 is a view illustrating another example of the configuration of the display illustrated in FIG. 1.

In the above embodiment, the display panel 10 includes the sub-pixels 13R, 13G, and 13B corresponding to three primary colors R, G, and B, respectively. However, the display panel 10 may include the sub-pixels 13R, 13G, 13B, and 13W corresponding to four primary colors R, G, B, and W, respectively, for example, as illustrated in FIG. 18.

Figure 19:
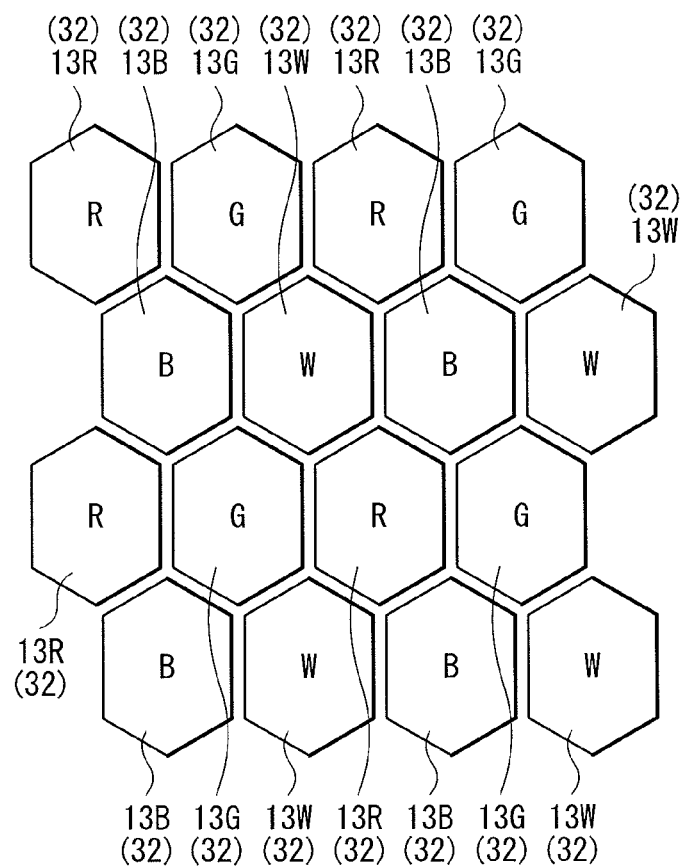
FIG. 19 is a view illustrating an example of a layout of the sub-pixels, when a layout of openings within each sub-pixel in the display illustrated in FIG. 18 is as illustrated in FIG. 4 or 10.

In this example, in the case where each shape of the reflective electrodes 32 and the sub-pixels 13 is a regular hexagon or is analogous thereto, the respective sub-pixels 13R, 13G, 13B, and 13W may be arranged so as to be laid out in a quadrangular fashion, for example, as illustrated in FIG. 19.

Figure 20:
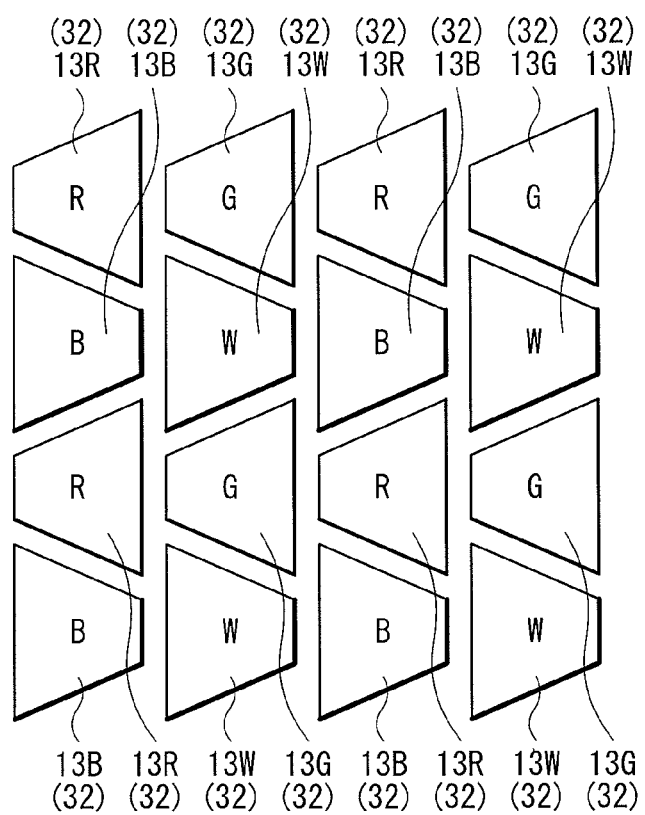
FIG. 20 is a view illustrating another example of a layout of the sub-pixels, when a layout of openings within each sub-pixel in the display illustrated in FIG. 18 is as illustrated in FIG. 8 or 11.

In the case where each shape of the reflective electrodes 32 and the sub-pixels 13 is a trapezoid or is analogous thereto, the respective sub-pixels 13R, 13G, 13B, and 13W may be arranged so as to be laid out in a quadrangular fashion, for example, as illustrated in FIG. 20. In this case, for example, the sub-pixels 13R and 13B are arranged alternately along each of corresponding columns, while being arranged such that the trapezoids therefor are oriented in directions opposite to one another in adjacent rows. Likewise, for example, the sub-pixels 13G and 13W are arranged alternately along each of corresponding columns, while being arranged such that the trapezoids therefor are oriented in directions opposite to one another in adjacent rows. Note that all the trapezoids arranged along each row are oriented in the same direction.

Figure 21:
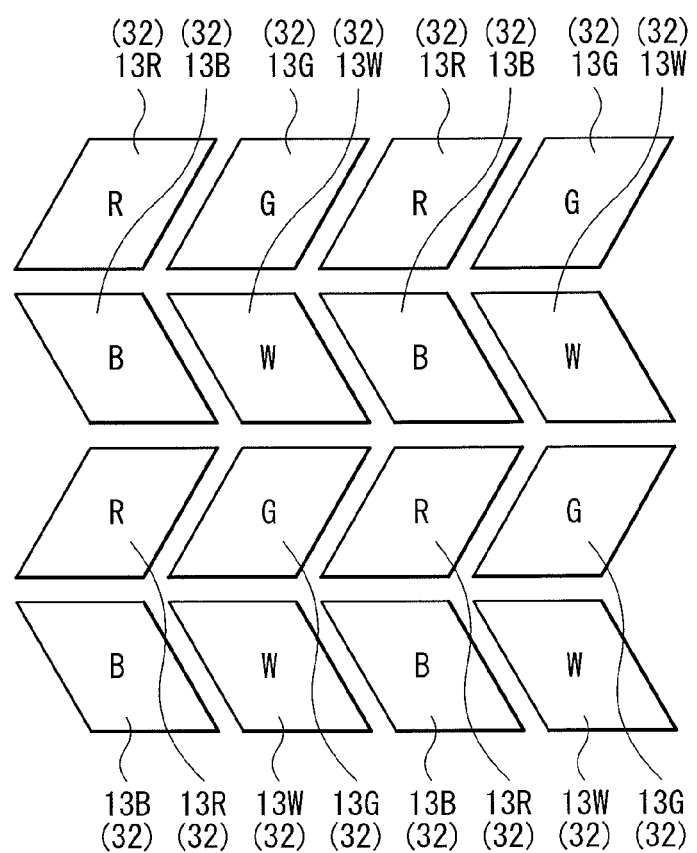
FIG. 21 is a view illustrating another example of a layout of the sub-pixels, when a layout of openings within each sub-pixel in the display illustrated in FIG. 18 is as illustrated in FIG. 9 or 12.

In the case where each shape of the reflective electrodes 32 and the sub-pixels 13 is an inclined quadrangle or is analogous thereto, the respective sub-pixels 13R, 13G, 13B, and 13W may be arranged and laid out in a quadrangular fashion, for example, as illustrated in FIG. 21. In this case, for example, the sub-pixels 13R and 13B are arranged alternately along each of corresponding columns, while being arranged such that the inclined directions thereof are opposite to one another in adjacent rows. Likewise, for example, the sub-pixels 13G and 13W are arranged alternately along each of corresponding columns, while being arranged such that the inclined directions thereof are opposite to one another in adjacent rows. Note that all the inclined directions of the quadrangles arranged in each row are the same as one another.

(Operation)

A description will be given of an example of an operation of the display 1 according to this embodiment.

In this display 1, the data line drive circuit 23 applies the signal voltage 22B corresponding to the image signal 20A to the individual data lines DTL, and in turn, the gate line drive circuit 24 and the drain line drive circuit 25 sequentially apply selection pulses according to the control signal 21A to the individual gate lines WSL and drain lines DSL, respectively. In response, the turn-on or turn-off of the pixel circuit 12 in each sub-pixel 13 is controlled, and a drive current is injected into the organic EL device 11 in each sub-pixel 13. As a result, electrons and holes are re-combined in the organic EL device 11, so that light is generated and extracted therefrom to the exterior. Finally, an image is displayed on the display region 10A of the display panel 10.

(Effect)

Next, a description will be given of an effect which the display 1 according to this embodiment produces.

In the past, various studies for organic EL displays have been ever conducted, for the purpose of improving the luminance while suppressing the increase in the power consumption. For instance, a technique has been proposed, in which reflectors of an inverted truncated-conical shape are provided on the light extraction side of an organic EL device. In an organic EL display provided with the reflector, light that has been emitted from the organic EL devices in an oblique direction is reflected in the vertical direction by the reflectors.

In the above organic EL display, the sparsely arranged reflectors decrease the opening ratio, which may cause a disadvantage of increasing the power consumption, and lowering the panel quality, for example, by causing burn-in on the panel.

In contrast, in this embodiment, the plurality of openings 33A that are arranged in a close packing manner have the array structure in which when a single virtual opening 33A is placed within the peripheral region 38 of the unit 36, and the center of the virtual opening 33A and the centers of a plurality of openings 33A located adjacent to the virtual opening 33A are connected to one another by straight lines (dotted line), only one basic FIG. 37 for the arrangement in the close packing manner is created but two basic figures therefor are not created. Due to this structure, the unit 36 has, for example, a hexagonal, trapezoidal, or inclined quadrangular shape. Accordingly, when the reflective electrode 32 has a planar shape corresponding to that of the unit 36, the arrangement loss of the openings 33A is minimized. Consequently, it is possible for this structure to provide the higher opening ratio, in comparison with other structures which have been studied so far or which cause the arrangement loss.

[2. Module and Application Examples]

Thereinafter, descriptions will be given of Application Examples of the display 1 that has been explained in the above embodiment and Modification Examples thereof. The display 1 is applicable to displays in electronic units in various fields, which display an image signal received from the exterior or generated internally, as an image or video. Examples of such electronic units include TV units, digital cameras, notebook personal computers, portable terminal devices such as portable phones, and video cameras.

(Module)

Figure 22:
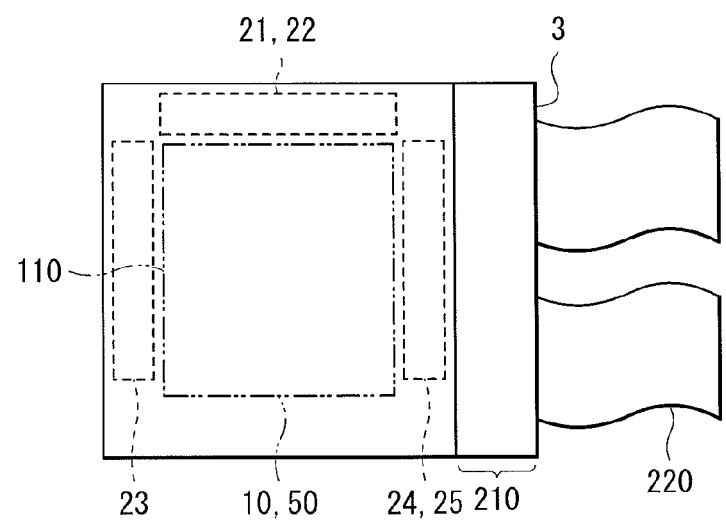
FIG. 22 is a plan view illustrating a schematic configuration of a module including the display according to any of the embodiment and Modification Examples thereof.

The display 1 is built into various electronic units such as Application Examples 1 to 5 that will be described hereinafter and the like, for example, as a module illustrated in FIG. 22. For example, the module has a region 210 which is exposed part of a member (not illustrated) used to hermetically seal the display panel 10 in one side of a board 3. Then, wires connected to the timing generation circuit 21, the image signal processing circuit 22, the data line drive circuit 23, the gate line drive circuit 24, and the drain line drive circuit 25 are extended to the exposed region 210, so that external connection terminals (not illustrated) therefor are created thereon. These external connection terminals may be provided with a flexible printed circuit (FPC) board 220 used to input or output signals.

(Application Example 1)

Figure 23:
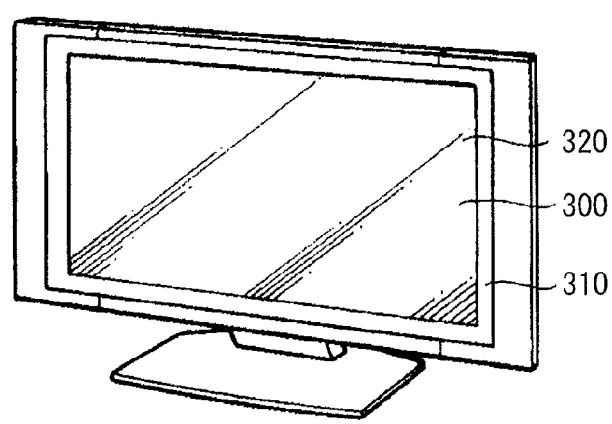
FIG. 23 is a perspective view illustrating the appearance of Application Example 1 of the display according to any of the embodiment and Modification Examples thereof.

FIG. 23 illustrates the appearance of a TV unit to which the display 1 is applied. This TV unit is equipped with, for example, an image display screen section 300 including a front panel 310 and a filter glass 320, and this image display screen section 300 is constituted by the display 1.

(Application Example 2)

Figure 24A:
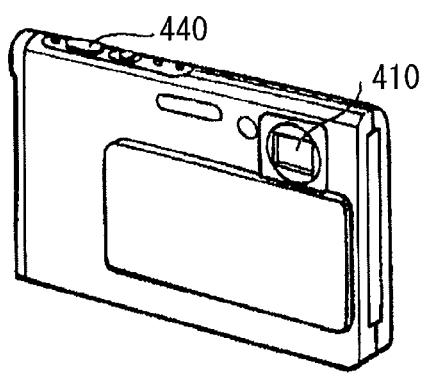
FIGS. 24A and 24B are perspective views illustrating the appearances of Application Example 2 as viewed from a front side thereof and a back side thereof, respectively.
Figure 24B:
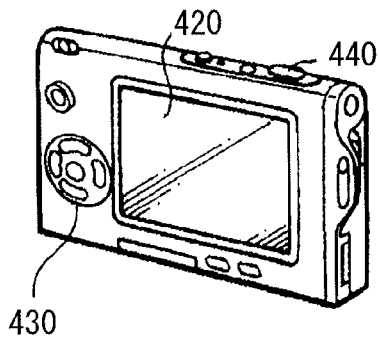

FIGS. 24A and 24B illustrate the appearance of a digital camera to which the display 1 is applied. This digital camera includes, for example, a light emitting section 410 for a flash, a display section 420, a menu switch 430, and a shutter button 440, and this display section 420 is constituted by the display 1.

(Application Example 3)

Figure 25:
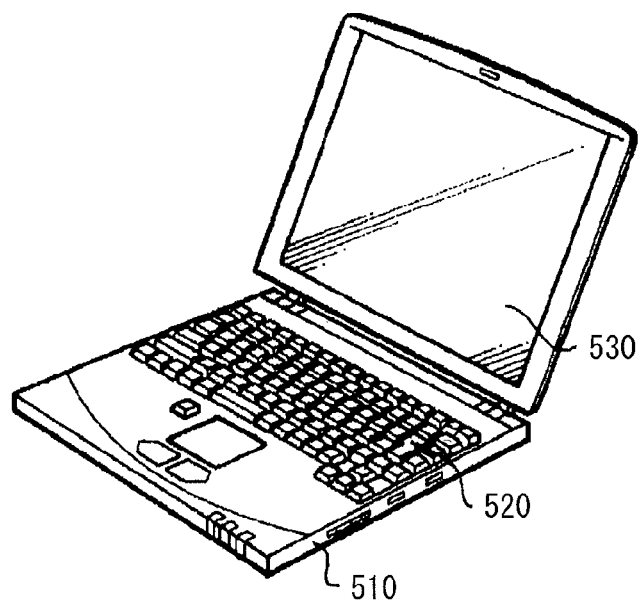
FIG. 25 is a perspective view illustrating the appearance of Application Example 3.

FIG. 25 illustrates the appearance of a notebook personal computer to which the display 1 is applied. This notebook personal computer includes, for example, a main unit 510, a keyboard 520 that is used to perform an input operation of letters, characters, and the like, and a display section 530 that displays an image, and this display section 530 is constituted by the display 1.

(Application Example 4)

Figure 26:
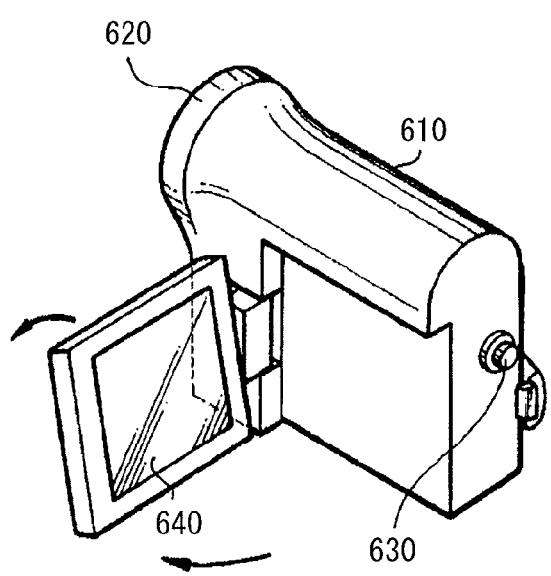
FIG. 26 is a perspective view illustrating the appearance of Application Example 4.

FIG. 26 illustrates the appearance of a video camera to which the display 1 is applied. This video camera includes, for example, a main unit 610, a subject capturing lens 620 provided at a front side surface of this main unit 610, a capturing start/stop switch 630, and a display section 640. This display section 640 is constituted by the display 1.

(Application Example 5)

FIGS. 27A to 27G illustrate the appearance of a portable phone to which the display 1 is applied. This portable phone is configured by, for example, connecting an upper casing 710 and a lower casing 720 with a connection portion (hinge portion) 730, and includes, for example, a display 740, a sub-display 750, a picture light 760, and a camera 770. One or both of the display 740 and the sub-display 750 are constituted by the display 1.

Up to this point, the present technology has been described by giving the above embodiment and Application Examples thereof. However, the present technology is not limited thereto, and various modifications are possible.

For example, the above embodiment and the like have been described as to the cases where the present technology is applied to displays. However, the present technology is applicable to other units such as illumination units and the like. When the present technology is applied to an illumination unit, the above display panel is a display panel.

The above embodiment and the like have been described as to the case where the display is of an active matrix type. However, the configuration of each pixel circuit 12 which implements an active matrix driving technique is not limited to the configurations that have been described in the above embodiment and the like. Accordingly, one or more capacitive devices or one or more transistors may be added to each pixel circuit 12, as necessary. In this case, one or more necessary drive circuits may be added to the display 1 according to the modification in the configuration of each pixel circuit 12, in addition to the timing generation circuit 21, the image signal processing circuit 22, the data line drive circuit 23, the gate line drive circuit 24, and the drain line drive circuit 25.

In the embodiment and the like, the timing generation circuit 21 and the image signal processing circuit 22 control the drive of the data line drive circuit 23, the gate line drive circuit 24, and the drain line drive circuit 25, but another circuit may control the drive thereof. In addition, the control of the data line drive circuit 23, the gate line drive circuit 24, and the drain line drive circuit 25 may be implemented either by hardware (circuit) or software (program).

The embodiment and the like have been described as to the case where the connection nodes of the source and drain in each of the write transistor Tws and the drive transistor Tdr are fixed. Needless to say, however, the connection locations of the source and drain in each transistor may be changed or reversed depending on the direction in which a current flows therethrough.

The embodiment and the like have been described as to the case where each of the write transistor Tws and the drive transistor Tdr is formed of an n-channel MOS TFT. However, one or both of the write transistor Tws and the drive transistor Tdr may be formed of a p-channel MOS TFT. In the case where the drive transistor Tdr is formed of a p-channel MOS TFT, the anode and the cathode of the organic EL device 11 in the above embodiment and the like are changed into a cathode and an anode, respectively. Furthermore, in the above embodiment and the like, each of the write transistor Tws and the drive transistor Tdr may be neither an amorphous silicon TFT nor a micro-silicon TFT, but a low-temperature polysilicon TFT, for example.

Note that the present technology may also include the following configuration.

(1) A display panel including:
a unit for each sub-pixel, the unit including a plurality of openings, the unit having an array structure in which the openings are arranged in a close packing manner,
wherein in the array structure of the unit, when a single virtual opening is placed within a peripheral region of the unit, and a center of the virtual opening and centers of a plurality of openings located adjacent to the virtual opening are connected to one another by straight lines, only one basic figure for the arrangement in the close packing manner is created but two basic figures therefor are not created.

(2) The display panel according to (1), wherein
each sub-pixel includes a self-luminous device and a plurality of reflection structures decreasing a divergence angle of light emitted from the self-luminous device, and
each of the reflection structures includes the openings and a reflection surface reflecting light emitted from the self-luminous device.

(3) The display panel according to (2), wherein
the self-luminous device has a structure in which an organic layer is sandwiched by a reflective electrode and a transparent electrode,
the reflection structures are formed on an upper surface of the reflective electrode while being in contact with the upper surface of the reflective electrode, and
the organic layer and the transparent electrode are formed at least in bottoms of the openings.

(4) The display panel according to (3), wherein the reflective electrode has a planar shape corresponding to a planar shape of the unit.

(5) The display panel according to (4), wherein each sub-pixel has a planar shape corresponding to the planar shape of the reflective electrode.

(6) The display panel according to (3), wherein the unit has a hexagonal shape.

(7) The display panel according to (3), wherein the unit has a trapezoidal shape.

(8) The display panel according to (3), wherein the unit has an inclined quadrangular shape.

(9) The display panel according to any one of (1) to (8), wherein the basic figure for the arrangement of the close packing manner is a triangular shape.

(10) The display panel according to any one of (1) to (9), wherein each of the openings has a point-symmetrical shape.

(11) A display including a display panel and a drive circuit driving the display panel, the display panel including
a unit for each sub-pixel, the unit including a plurality of openings, the unit having an array structure in which the openings are arranged in a close packing manner,
wherein in the array structure of the unit, when a single virtual opening is placed within a peripheral region of the unit, and a center of the virtual opening and centers of a plurality of openings located adjacent to the virtual opening are connected to one another by straight lines, only one basic figure for the arrangement in the close packing manner is created but two basic figures therefor are not created.

(12) An electronic unit with a display, the display including a display panel and a drive circuit driving the display panel, the display panel including a unit for each sub-pixel, the unit including a plurality of openings, the unit having an array structure in which the openings are arranged in a close packing manner, wherein in the array structure of the unit, when a single virtual opening is placed within a peripheral region of the unit, and a center of the virtual opening and centers of a plurality of openings located adjacent to the virtual opening are connected to one another by straight lines, only one basic figure for the arrangement in the close packing manner is created but two basic figures therefor are not created.

The present technology contains subject matter related to that disclosed in Japanese Priority Patent Application JP 2011-194811 filed in the Japan Patent Office on Sep. 7, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display panel comprising:
   a plurality of pixels, each pixel of the plurality of pixels including at least one sub-pixel;
   a unit for each sub-pixel, the unit for each sub-pixel having an array structure in which a plurality of openings are arranged such that, for all openings of the plurality of openings located along each edge of the unit, a vertex located within a peripheral region of the unit and centers of first and second openings closest to the vertex form a triangle having interior angles substantially equal to sixty degrees, wherein the vertex located within the peripheral region of the unit is unique for each triangle.

2. The display panel according to claim 1, wherein each sub-pixel includes a self-luminous device and a plurality of reflection structures that decrease a divergence angle of light emitted from the self-luminous device, and
   each of the reflection structures includes the openings and a reflection surface reflecting light emitted from the self-luminous device.

3. The display panel according to claim 2, wherein the self-luminous device has a structure in which an organic layer is sandwiched by a reflective electrode and a transparent electrode,
   the reflection structures are formed on an upper surface of the reflective electrode while being in contact with the upper surface of the reflective electrode, and
   the organic layer and the transparent electrode are formed at least in bottoms of the openings.

4. The display panel according to claim 3, wherein the reflective electrode has a planar shape corresponding to a planar shape of the unit.

5. The display panel according to claim 4, wherein each sub-pixel has a planar shape corresponding to the planar shape of the reflective electrode.

6. The display panel according to claim 3, wherein the unit has a hexagonal shape.

7. The display panel according to claim 3, wherein the unit has a trapezoidal shape.

8. The display panel according to claim 3, wherein the unit has an inclined quadrangular shape.

9. The display panel according to claim 1, wherein each of the openings has a point-symmetrical shape.

10. A display comprising:
    a display panel including a plurality of pixels, each pixel of the plurality of pixels including at least one sub-pixel; and
    a drive circuit configured to drive the display panel, wherein the display panel includes a unit for each sub-pixel, the unit for each sub-pixel having an array structure in which a plurality of openings are arranged such that, for all openings of the plurality of openings located along each edge of the unit a vertex located within a peripheral region of the unit and centers of first and second openings closest to the vertex form a triangle having interior angles substantially equal to sixty degrees, wherein the vertex located within the peripheral region of the unit is unique for each triangle.

11. An electronic unit with a display, the display comprising:
    a display panel including a plurality of pixels, each pixel of the plurality of pixels including at least one sub-pixel; and
    a drive circuit configured to drive the display panel, wherein the display panel includes a unit for each sub-pixel, the unit for each sub-pixel having an array structure in which a plurality of openings are arranged such that, for all openings of the plurality of openings located along each edge of the unit a vertex located within a peripheral region of the unit and centers of first and second openings closest to the vertex form a triangle having interior angles substantially equal to sixty degrees, wherein the vertex located within the peripheral region of the unit is unique for each triangle.

12. The display according to claim 10, wherein each sub-pixel includes a self-luminous device and a plurality of reflection structures that decrease a divergence angle of light emitted from the self-luminous device, and
    each of the reflection structures includes the openings and a reflection surface reflecting light emitted from the self-luminous device.

13. The display according to claim 12, wherein the self-luminous device has a structure in which an organic layer is sandwiched by a reflective electrode and a transparent electrode,
    the reflection structures are formed on an upper surface of the reflective electrode while being in contact with the upper surface of the reflective electrode, and
    the organic layer and the transparent electrode are formed at least in bottoms of the openings.

14. The display according to claim 13, wherein the reflective electrode has a planar shape corresponding to a planar shape of the unit.

15. The display according to claim 14, wherein each sub-pixel has a planar shape corresponding to the planar shape of the reflective electrode.

16. The electronic unit according to claim 11, wherein each sub-pixel includes a self-luminous device and a plurality of reflection structures that decrease a divergence angle of light emitted from the self-luminous device, and
    each of the reflection structures includes the openings and a reflection surface reflecting light emitted from the self-luminous device.

17. The electronic unit according to claim 16, wherein the self-luminous device has a structure in which an organic layer is sandwiched by a reflective electrode and a transparent electrode,
    the reflection structures are formed on an upper surface of the reflective electrode while being in contact with the upper surface of the reflective electrode, and
    the organic layer and the transparent electrode are formed at least in bottoms of the openings.

18. The electronic unit according to claim 17, wherein the reflective electrode has a planar shape corresponding to a planar shape of the unit.

19. The electronic unit according to claim 18, wherein each sub-pixel has a planar shape corresponding to the planar shape of the reflective electrode.

* * * * *